United States Patent [19]

Arima

[11] Patent Number: 5,703,391
[45] Date of Patent: Dec. 30, 1997

[54] SEMICONDUCTOR DEVICE HAVING ELEMENT ISOLATING INSULATING FILM IN CONTACT HOLE

[75] Inventor: Satoshi Arima, Hyogo, Japan

[73] Assignee: Mitsubishi Denki Kabushiki Kaisha, Tokyo, Japan

[21] Appl. No.: 673,183

[22] Filed: Jun. 27, 1996

[51] Int. Cl.$^6$ .................... H01L 29/76; H01L 29/94; H01L 27/11
[52] U.S. Cl. .................... 257/382; 257/374; 257/401; 257/903
[58] Field of Search .................... 257/374, 382, 257/401, 903

[56] References Cited

U.S. PATENT DOCUMENTS

| | | | |
|---|---|---|---|
| 5,278,082 | 1/1994 | Kawamura | 257/382 |
| 5,294,822 | 3/1994 | Verrett | 257/382 |
| 5,323,046 | 6/1994 | Ema et al. | 257/382 |

FOREIGN PATENT DOCUMENTS 6-85204  3/1995  Japan .

Primary Examiner—Valencia Martin Wallace
Attorney, Agent, or Firm—Lowe, Price, LeBlanc & Becker

[57] ABSTRACT

A semiconductor device is obtained which can suppress decrease in contact area between an interconnection layer and a semiconductor substrate. Further, a method of manufacturing a semiconductor device which can increase in contact resistance between first and second interconnection layers can be obtained. In the semiconductor device, upper surface of an element isolating insulating film is removed near a boundary point between the element isolating oxide film and the semiconductor substrate. Consequently, the surface of the semiconductor substrate is exposed where the element isolating insulating film has been removed. Since a conductive layer is formed to be in contact with the exposed semiconductor substrate, contact area between the conductive layer and the semiconductor substrate is increased. In the manufacturing method of the semiconductor device, foreign matters on the first interconnection layer derived from wet etching using hydrofluoric acid solution is removed by anisotropic dry etching, and thereafter a second interconnection layer is formed on the first interconnection layer.

5 Claims, 6 Drawing Sheets

SEMICONDUCTOR DEVICE HAVING ELEMENT ISOLATING INSULATING FILM IN CONTACT HOLE

BACKGROUND OF THE INVENTION

1. Field of the Invention

FIG. 10 is a cross section showing a conventional semiconductor device. Referring to FIG. 10, in a conventional semiconductor device, an element isolating oxide film 102 is formed at a prescribed region on a main surface of a semiconductor substrate 1. At the main surface of semiconductor substrate 1 adjacent to element isolating oxide film 102, an n type impurity diffusion layer 7 is formed. At prescribed regions of the main surface of semiconductor substrate 1, a pair of n type source/drain regions 6 are formed on both sides of a channel region. One of the source/drain regions 6 is formed to be continuous to impurity diffusion layer 7. On the channel region, a polycrystalline silicon film 4b is formed with a gate oxide film of silicon oxide film 3b interposed, and a polycrystalline silicon film 5b is formed further thereon. Polycrystalline silicon films 4b and 5b constitute a gate electrode. At a prescribed region on element isolating oxide film 102, a first interconnection layer 4a is formed with a silicon oxide film 3a interposed. A second interconnection layer 5a is formed on and in contact with impurity diffusion layer 7, element isolating oxide film 102 and first interconnection layer 4a. The first and second interconnection layers 4a and 5a provide a multilayered interconnection 10. The first and second interconnection layers 4a and 5a are both formed of polycrystalline silicon film.

FIGS. 11 to 17 are cross sections showing manufacturing process of the conventional semiconductor device shown in FIG. 10. The process for manufacturing the conventional semiconductor device will be described with reference to FIGS. 11 to 17. First, referring to FIG. 11, an element isolating oxide film 102 is formed at a prescribed region on the main surface of semiconductor substrate 1, by using LOCOS (Local Oxidation of Silicon) method. On element isolating oxide film 102 and on the main surface of semiconductor substrate 1, a silicon oxide film 3 is formed, and a phosphorus doped polycrystalline silicon film 4 is formed thereon. At a prescribed region of the polycrystalline silicon film 4, a resist pattern 11 such as shown in FIG. 12 is formed. Thereafter, using resist pattern 11 as a mask, polycrystalline silicon film 4 is anisotropically etched. Consequently, a contact hole 100 such as shown in FIG. 12 is formed, and the first interconnection layer 4a of polycrystalline silicon film is formed. Thereafter, resist pattern 11 is removed, resulting in the structure shown in FIG. 13.

Then, using polycrystalline silicon film 4 and first interconnection layer 4a as a mask, silicon oxide film 3 positioned in contact hole 100 is removed by etching, using a hydrofluoric acid solution. Consequently, silicon oxide films 3a and 3b having such a shape as shown in FIG. 14 result. Thereafter, referring to FIG. 15, a phosphorus doped polycrystalline silicon film 5 is formed on and in contact with the main surface of semiconductor substrate 1 and element isolating oxide film 102 positioned in contact hole 100, polycrystalline silicon film 4 and first interconnection layer 4a. At a prescribed region on polycrystalline silicon film 5, a resist pattern 12 is formed. Thereafter, using resist pattern 12 as a mask, polycrystalline silicon films 5 and 4 are anisotropically etched. Consequently, the second interconnection layer 5a and a gate electrode consisting of polycrystalline silicon films 4b and 5b such as shown in FIG. 16 are formed. Silicon oxide film 3b positioned below polycrystalline silicon film 4b provides a gate oxide film. Thereafter, resist pattern 12 is removed.

Then, referring to FIG. 17, by introducing ions of n type impurity to the main surface of semiconductor substrate 1 using polycrystalline silicon film 5b and second interconnection layer 5a as a mask, n type source/drain regions 6 are formed. By heat treatment, n type impurity introduced in the source/drain regions 6 is electrically activated, and phosphorus in the second interconnection layer 5a is diffused toward the main surface of semiconductor substrate 1. Consequently, n type impurity diffusion layer 7 is formed continuous to one of the source/drain regions 6.

The conventional semiconductor device is manufactured in this manner. However, in the conventional semiconductor device, the second interconnection layer 5a is in contact with impurity diffusion layer 7 at a region having the length of L1 as shown in FIG. 10. The length L1 of the contact region is defined by the resist pattern 12 shown in FIG. 15. However, it is possible that resist pattern 12 is misaligned during the steps of manufacturing, and in such a case, the contact length L1 shown in FIG. 10 becomes shorter, resulting in smaller contact area between the second interconnection layer 5a and impurity diffusion layer 7. If the contact area becomes smaller, contact resistance becomes higher, possibly causing signal delay in the integrated circuit and attenuation of signal levels. In the conventional structure shown in FIG. 10, it has been difficult to prevent such reduction in contact area caused by misalignment of resist pattern 12 shown in FIG. 15.

In the conventional manufacturing process shown in FIGS. 13 and 14, silicon oxide film 3 in contact hole 100 is removed by wet etching using hydrofluoric acid solution, using polysilicon film 4 and first interconnection layer 4a as a mask. In this case, upper surfaces of polysilicon film 4 and first interconnection layer 4a are also dipped in the hydrofluoric acid solution, and as a result, foreign matters such as water marks are undesirably left on the upper surfaces of polycrystalline silicon film 4 and first interconnection layer 4a. The water mark means a mark of water drop left after drying. When there is a water mark, contact resistance of polysilicon film 4 and first interconnection 4a with respective upper layers is increased. If polycrystalline silicon film 5 such as shown in FIG. 15 is formed on polycrystalline silicon film 4 and first interconnection layer 4a with foreign matters existing on the upper surfaces thereof, the contact resistance between the second interconnection layer 5a of polycrystalline silicon film and the first interconnection layer 4a of polycrystalline silicon film is undesirably increased in such a structure as shown in FIG. 16.

SUMMARY OF THE INVENTION

An object of the present invention is to provide a semiconductor device which can address the problem of increase in contact resistance between the semiconductor substrate and the interconnection layer even when the resist pattern is misaligned.

Another object of the present invention is to provide a method of manufacturing a semiconductor device by which increase in contact resistance between first and second interconnection layers can be prevented.

According to one aspect of the present invention, the semiconductor device includes a semiconductor substrate, an element isolating insulating film and a conductive layer. The semiconductor substrate has a main surface, and the element isolating insulating film is formed on the main surface of the semiconductor substrate. The conductive layer is formed to be in contact with the main surface of the semiconductor substrate and with the surface of the element isolating insulating film. At least an upper surface of the element isolating insulating film near the boundary between the element isolating insulating film and the main surface of the semiconductor substrate is removed. The conductive layer is formed to be in contact with the element isolating insulating film and the semiconductor substrate positioned at the boundary region. As the upper surface of the element isolating insulating film near the boundary between the main surface of the semiconductor substrate and the element isolating insulating film is removed and the conductive layer is formed to be in contact with the boundary region, the surface of the semiconductor substrate is exposed where the element isolating insulating film is removed, and as a result, contact area between the conductive layer and the semiconductor substrate is increased. Therefore, even if the resist pattern for patterning the conductive layer is misaligned, decrease in contact area between the conductive layer and the semiconductor substrate can be suppressed.

Further, in the semiconductor device in accordance with the above described one aspect, the portion near the boundary between the main surface of the semiconductor substrate and the element isolating insulating film may be formed to have a concave shape.

Further, the semiconductor device in accordance with the above described one aspect may be adapted to have an impurity region of a first conductivity type at least at the main surface of the semiconductor substrate where the conductive layer contacts. In the semiconductor device in accordance with the above described one aspect, the conductive layer may be adapted to include a first interconnection layer formed on an upper surface of the element isolating insulating film, and a second interconnection layer formed to be in contact with the first interconnection layer, the element isolating insulating film and the semiconductor substrate. In this case, that region at the upper surface of the element isolating insulating film which is positioned below the side surface of the first interconnection layer may have a step.

The semiconductor device in accordance with the above described one aspect may include an impurity region of a first conductivity type formed on the main surface of the semiconductor substrate where the conductive layer contacts, and a pair of source/drain regions and a gate electrode, with one of the source/drain regions being continuous to the impurity region of the first conductivity type. In this case, the pair of source/drain regions are formed spaced from each other defining a channel region at the main surface of the semiconductor substrate, and the regions have the first conductivity type. The gate electrode is formed on the channel region with a gate insulating film interposed. In this case, it may be adapted to include a first interconnection layer and a second interconnection layer formed thereon and in contact therewith, and the first interconnection layer may be formed by the same layer as the lower layer of the gate electrode and the second interconnection layer may be formed by the same layer as the upper layer of the gate electrode.

In the method of manufacturing a semiconductor device in accordance with another aspect of the present invention, an element isolating insulating film is formed on the main surface of a semiconductor substrate. On the upper surfaces of the semiconductor substrate and the element isolating insulating film, an oxide film is formed, and a first interconnection layer is formed thereon. A resist pattern is formed on the first interconnection layer, and the first interconnection is etched by using the resist pattern as a mask, thereby forming a contact hole. The resist pattern is removed, and thereafter, the oxide film positioned in the contact hole is removed by wet etching, using a hydrofluoric acid solution. The upper surface of the first interconnection layer and the upper surface of the element isolating insulating film positioned in the contact hole are etched by anisotropic dry etching. After anisotropic dry etching, a second interconnection layer in contact with the main surface of the semiconductor substrate and the upper surface of the element isolating insulating film positioned in the contact hole and the upper surface of the first interconnection layer is formed. As described above, in the method of manufacturing the semiconductor device, the oxide film positioned in the contact hole is removed by wet etching using hydrofluoric acid solution, the upper surface of the first interconnection layer is etched by anisotropic dry etching, and the second interconnection layer is formed on the first interconnection layer. Therefore, the second interconnection layer can be formed with foreign matters such as water marks adhered on the first interconnection layer during wet etching being removed. Therefore, increase in contact resistance between the first and second interconnection layers can be prevented. Further, since the upper surface of the element isolating insulating film positioned in the contact hole is etched by anisotropic dry etching, the upper surface of the element isolating insulating film at the boundary between the semiconductor substrate and the element isolating insulating film is also removed by etching. Therefore, the surface of the semiconductor substrate is exposed at the boundary where the element isolating insulating film is removed, and hence the contact area between the semiconductor substrate and the second interconnection layer is increased.

In the method of manufacturing a semiconductor device in accordance with the above described another aspect, anisotropic dry etching may be performed such that a concave portion is formed near the boundary between the upper surface of the element isolating insulating film and the main surface of the semiconductor substrate.

In the method of manufacturing a semiconductor device in accordance with a still further aspect of the present invention, an element isolating insulating film is formed on the main surface of a semiconductor substrate. A first layer is formed on the main surface of the semiconductor substrate and on the upper surface of the element isolating insulating film. A resist pattern is formed on the first layer, and thereafter, a contact hole reaching the semiconductor substrate and the element isolating insulating film is formed by etching, using the resist pattern as a mask. After the resist pattern is removed, the upper surface of the element isolating insulating film positioned in the contact hole is etched by anisotropic dry etching. An interconnection layer is formed to be in contact with the main surface of the semiconductor substrate positioned in the contact hole and the upper surface of the element isolating insulating film. In the method of manufacturing a semiconductor device, the upper surface of the element isolating insulating film positioned in the contact hole is anisotropically dry etched, and thereafter an interconnection is formed to be in contact with the main surface of the semiconductor substrate and with the upper surface of the element isolating insulating film. Therefore, the main surface of the semiconductor substrate is exposed where the element isolating insulating film has been removed by etching, and hence the contact area between the interconnection layer and the semiconductor substrate can be increased by the amount of the main surface of the semiconductor substrate which is exposed.

In the method of manufacturing the semiconductor device in accordance with the above described still further aspect, etching of the upper surface of the element isolating insulating film by anisotropic dry etching may be performed such that a concave portion is formed near the boundary between the upper surface of the element isolating insulating film and the upper surface of the semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
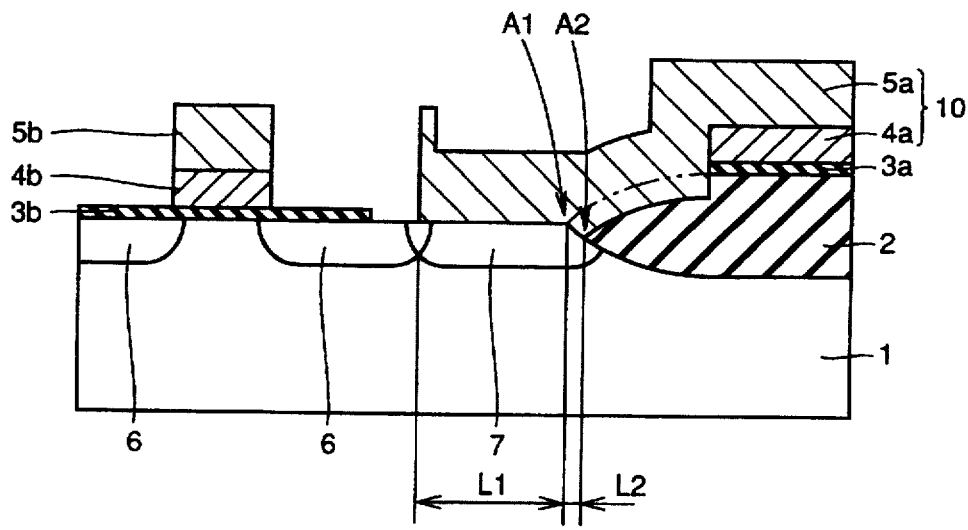
FIG. 1 is a cross section showing a semiconductor device in accordance with one embodiment of the present invention.

An embodiment of the present invention will be described with reference to the figures. Referring to FIG. 1, in the semiconductor device in accordance with one embodiment of the present invention, at a prescribed region on a main surface of a p type silicon substrate 1, an element isolating oxide film 2 is formed, by LOCOS method. The element isolating oxide film 2 is formed to have maximum thickness of about 4000 Å. At the main surface of the semiconductor substrate adjacent to element isolating oxide film 2, an n type impurity diffusion layer 7 is formed. At the main surface of semiconductor substrate 1, a pair of n type source/drain regions 6 are formed spaced by a prescribed distance, on both sides of a channel region. One of the source/drain regions 6 is formed continuous to impurity diffusion layer 7.

On the channel region, a polysilicon film 4b is formed with a silicon oxide film 3b constituting a gate oxide film interposed, and a polycrystalline silicon film 5b is formed further thereon. Polycrystalline silicon films 4b and 5b constitute a gate electrode. At a prescribed region on element isolating oxide film 2, a first interconnection layer 4a of a polycrystalline silicon film is formed, with silicon oxide film 3a interposed. A second interconnection layer 5a of polycrystalline silicon film is formed on and in contact with the first interconnection layer 4a, the element isolating oxide film 2 and the impurity diffusion layer 7. The first and second interconnection layers 4a and 5a provide a multilayered interconnection 10.

In this embodiment, different from the prior art, a portion of the upper surface of the element isolating oxide film 2 is removed by a prescribed thickness. More specifically, the upper portion of the element isolating oxide film 2 is removed by a prescribed thickness from a portion below the side surface of first interconnection layer 4a to a portion which is in contact with the main surface of the semiconductor substrate 1. Therefore, the point of boundary (A2) between the main surface of the semiconductor substrate 1 and the upper surface of the element isolating insulating film 2 moves to the right as compared with the point of boundary (A1) when element isolating oxide film 2 is not removed. Therefore, as compared with the prior art, the contact length between the second interconnection layer 5a and impurity diffusion layer 7 is made longer by L2. As a result, contact area between second interconnection 5a and impurity diffusion layer 7 is increased as compared with the prior art. Consequently, decrease in contact area caused when the resist pattern for patterning second interconnection layer 5a is misaligned can be effectively suppressed.

If element isolating oxide film 2 is removed by the thickness of about 1000 Å, the length L2 will be about 1000 Å. The height of the point A2 will be about 200 Å to about 300 Å below the main surface of the semiconductor substrate 1. Silicon oxide film 3 has a thickness of about 50 Å to about 200 Å, polycrystalline silicon film 4a has a thickness of about 200 Å to about 1000 Å, and second interconnection layer 5a has a thickness of about 1000 to about 2000 Å.

Figure 2:
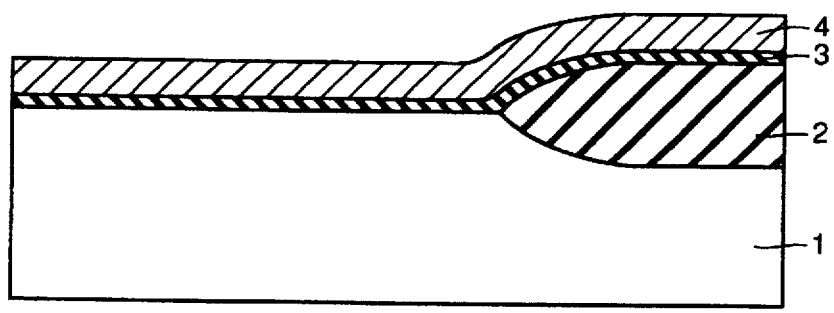
FIGS. 2 to 9 are cross sections showing the manufacturing process of the semiconductor device shown in FIG. 1.
Figure 3:
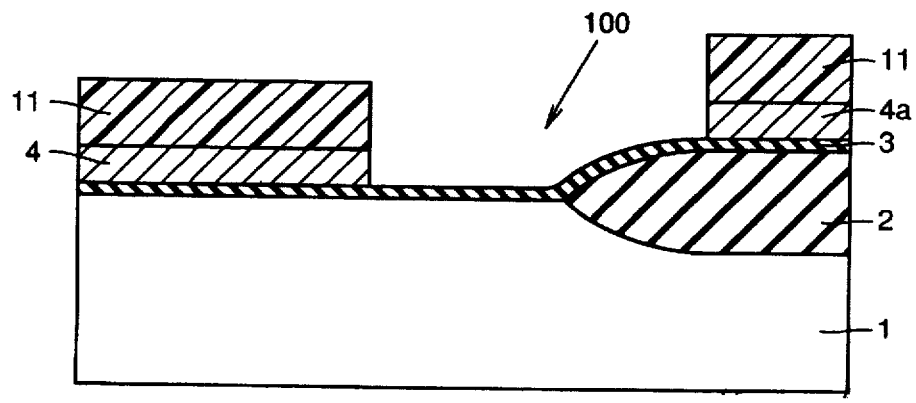

Referring to FIGS. 2 to 9, the process of manufacturing the semiconductor device in accordance with the embodiment shown in FIG. 1 will be described. First, as shown in FIG. 2, at a prescribed region on the main surface of p type silicon substrate 1, element isolating oxide film 2 having the thickness of about 4000 Å is formed by the LOCOS method. On element isolating oxide film 2 and on the semiconductor substrate 1, silicon oxide film 3 having the thickness of about 50 Å to about 200 Å is formed, and phosphorus doped polycrystalline silicon film 4 having the thickness of about 200 Å to about 1000 Å is formed thereon. Thereafter, resist pattern 11 is formed at a prescribed region of polycrystalline silicon film 4. Then, polycrystalline silicon film 4 is anisotropically etched by using resist pattern 11 as a mask. Consequently, first interconnection layer 4a of polycrystalline silicon film and gate electrode layer 4a such as shown in FIG. 3 are formed. At the same time, contact hole 100 is opened. Thereafter, resist 11 is removed, resulting in a structure shown in FIG. 4.

Figure 4:
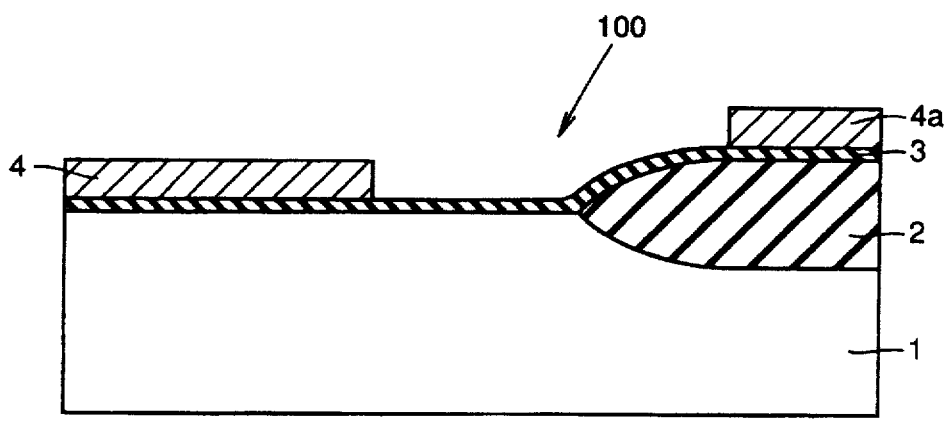
Figure 5:
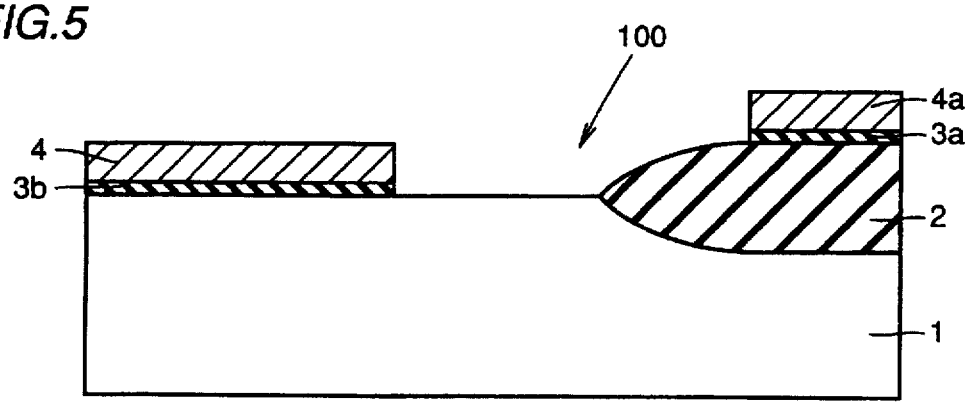
Figure 6:
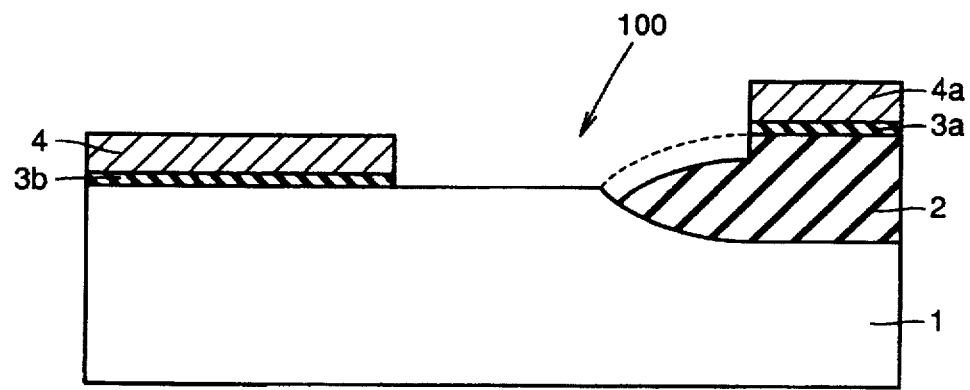

Thereafter, from the state of FIG. 4, silicon oxide film 3 positioned in contact hole 100 is removed by wet etching using hydrofluoric acid solution, using first interconnection layer 4a and polycrystalline silicon film 4 as a mask. Consequently, silicon oxide films 3a and 3b as shown in FIG. 5 are obtained. Now, because of the wet etching using hydrofluoric acid solution, foreign matters such as water marks are left on the upper surfaces of polycrystalline silicon film 4 and first interconnection layer 4a. From this state, the entire surface is anisotropically etched, using anisotropic dry ion etching. This results in the structure shown in FIG. 6. By the anisotropic etching, foreign matters such as water marks adhered on the upper surfaces of polycrystalline silicon film 4 and first interconnection layer 4a are removed, and the upper surface of the element isolating oxide film 2 positioned in contact hole 100 is removed. The amount of etching of the element isolating oxide film 2 is set to be about 500 Å to about 1000 Å.

Figure 7:
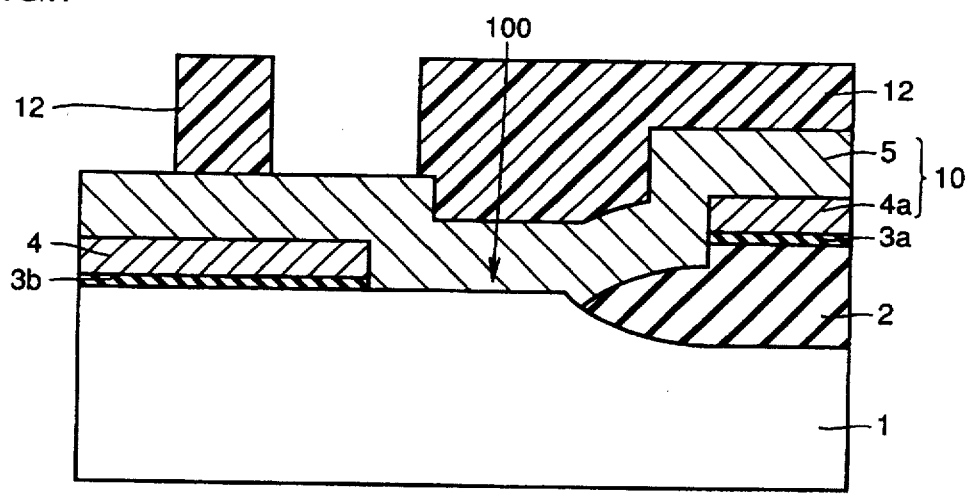
Figure 8:
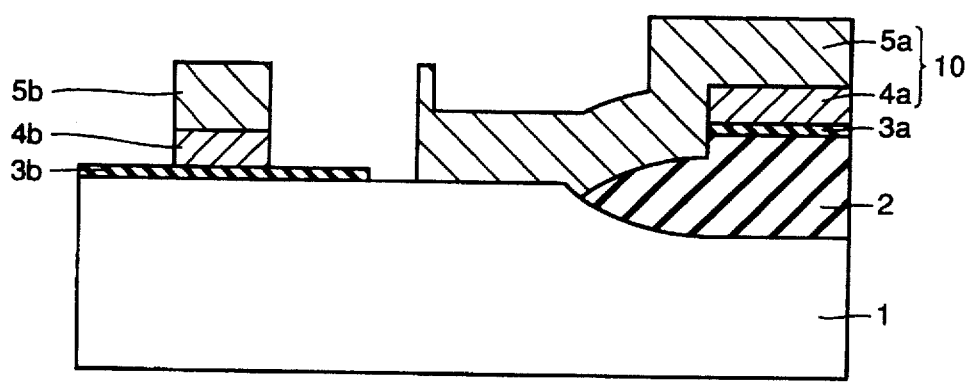

From this state, phosphorus doped polycrystalline silicon film 5 is deposited to the thickness of about 1000 Å to about 2000 Å as shown in FIG. 7. Since polycrystalline silicon film 5 constituting the second interconnection layer is deposited with the foreign matters on the upper surface of polycrystalline silicon film 4 and first interconnection layer 4a removed, increase in contact resistance between subsequently formed second interconnection layer 5a and first interconnection layer 4a can be effectively suppressed. Thereafter, at a prescribed region of polycrystalline silicon film 5, a resist pattern 12 for forming the second interconnection layer and the gate electrode is formed. By anisotropically etching polycrystalline silicon film 5 using resist pattern 12 as a mask, a second interconnection layer 5a of polycrystalline silicon film, and a gate electrode formed of polycrystalline silicon films 4b and 5b, such as shown in FIG. 8, can be obtained.

Figure 9:
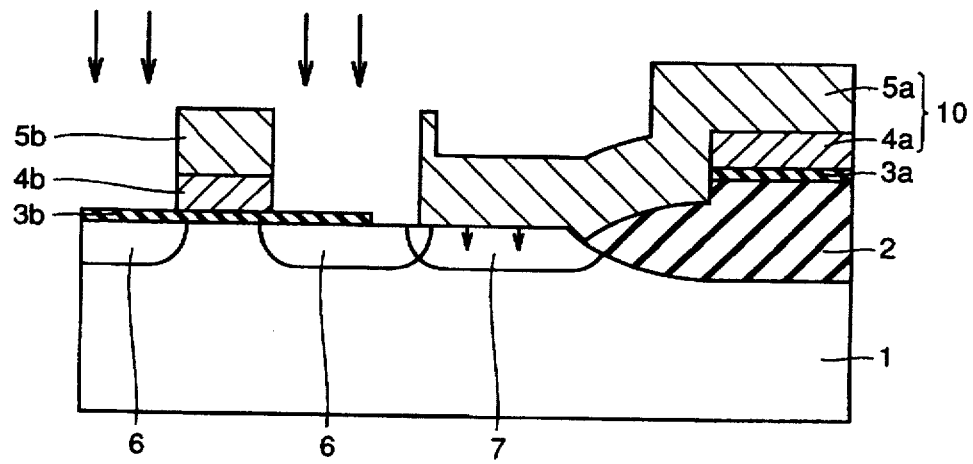
Figure 10:
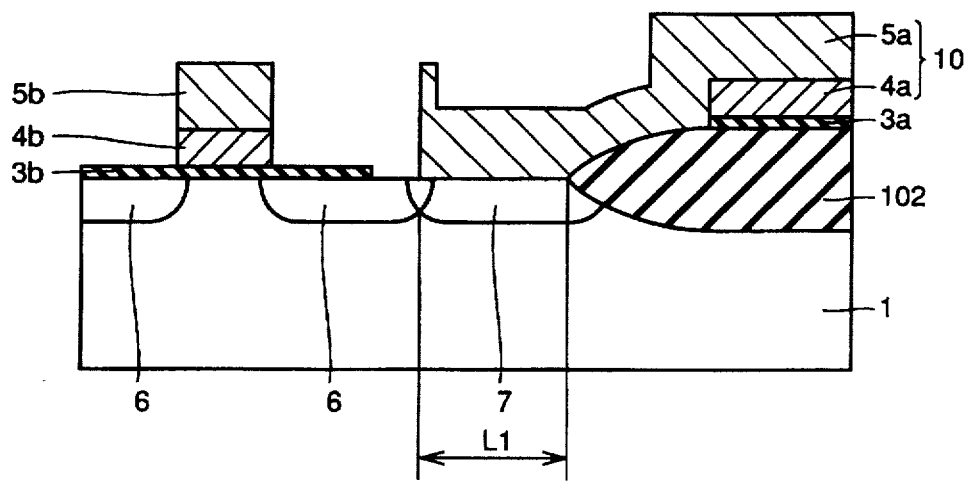
FIG. 10 is a cross section showing a conventional semiconductor device.
Figure 11:
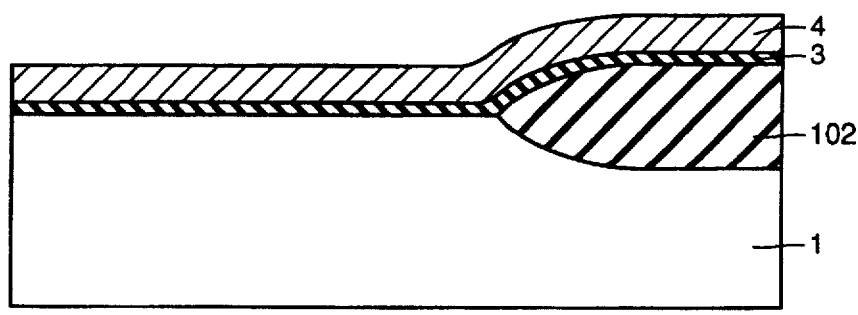
FIGS. 11 to 17 are cross sections showing the manufacturing process of the conventional semiconductor device shown in FIG. 10.
Figure 12:
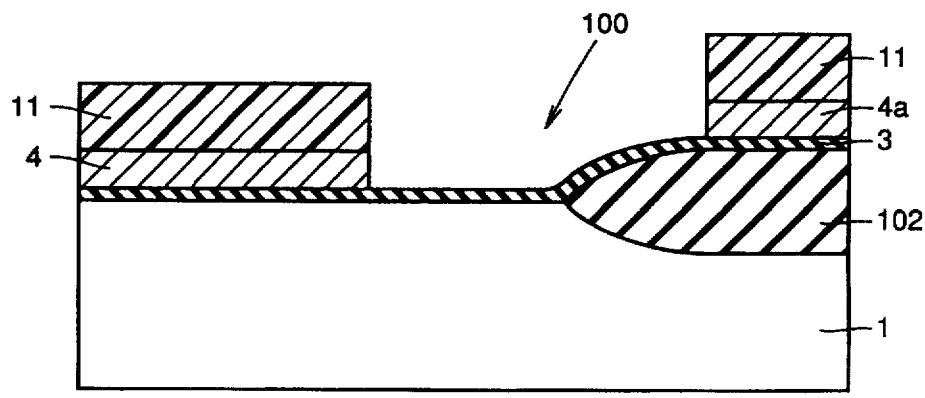
Figure 13:
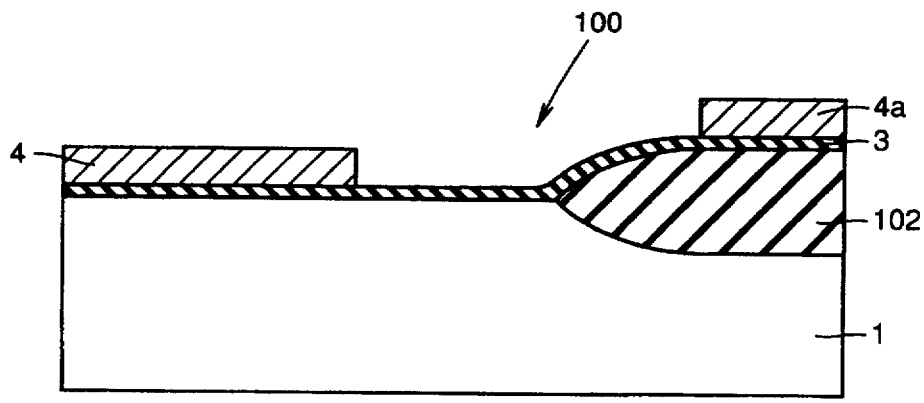
Figure 14:
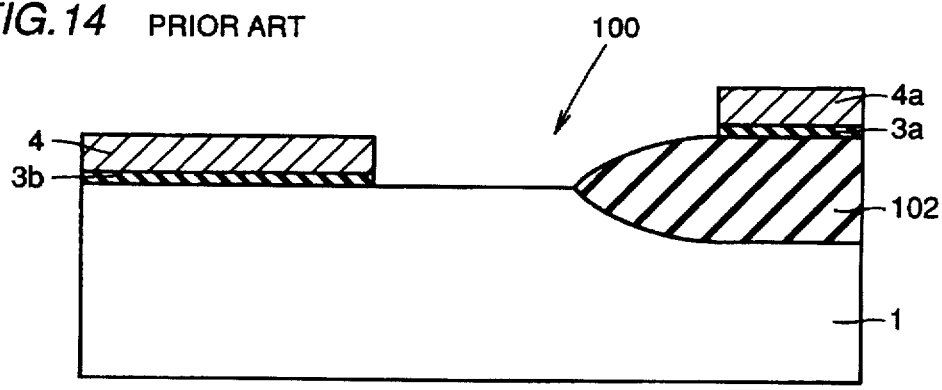
Figure 15:
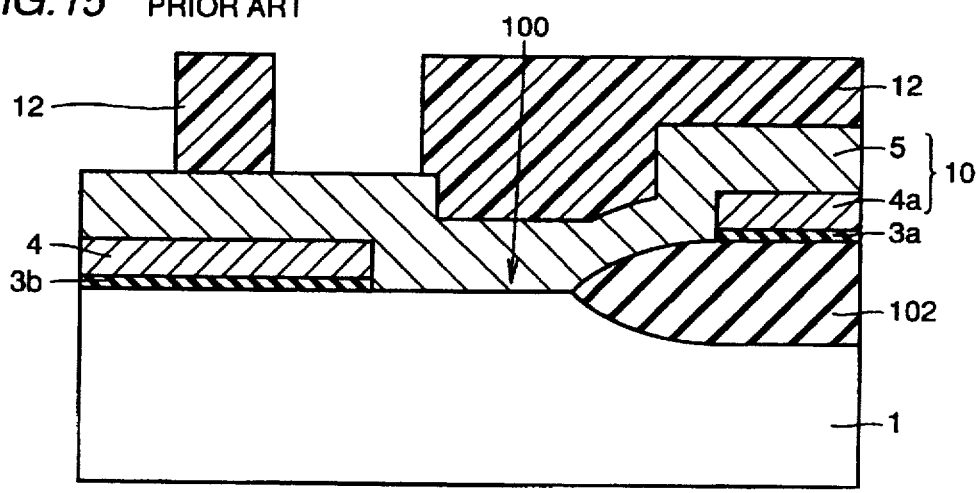
Figure 16:
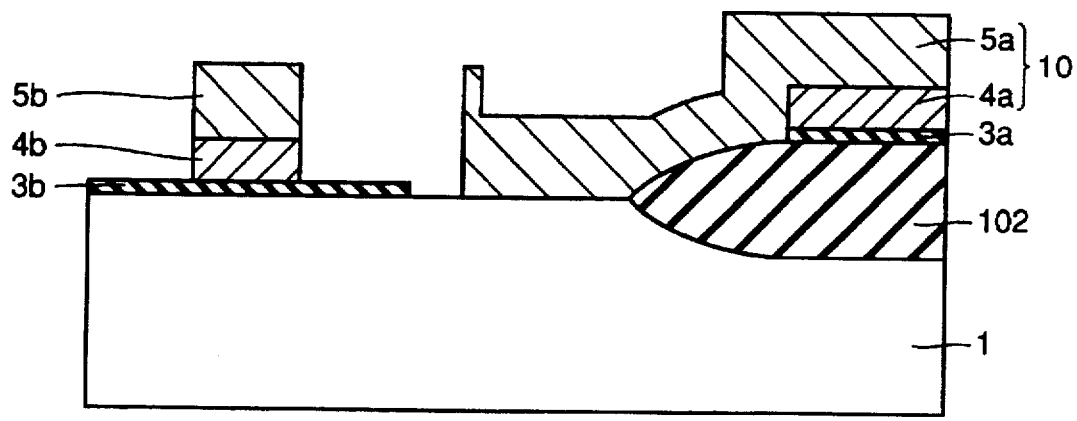
Figure 17:
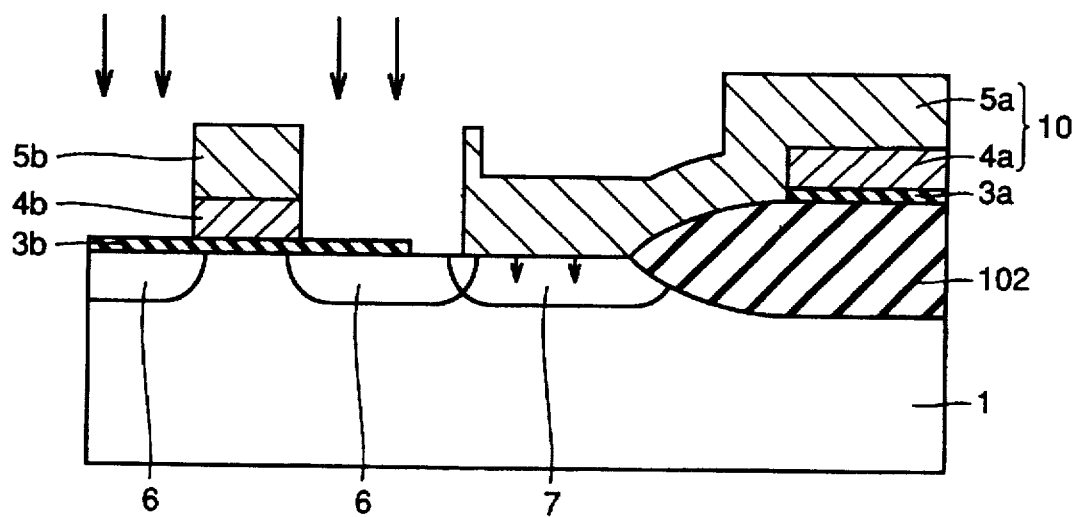

Thereafter, referring to FIG. 9, an n type impurity is ion-implanted to the surface of semiconductor substrate 1 using polycrystalline silicon films 4b and 5b as well as second interconnection layer 5a as a mask, whereby a pair of n type source/drain region 6 are formed. Thereafter, by heat treatment, impurity in the source/drain regions 6 is electrically activated, and phosphorus is diffused toward the main surface of semiconductor substrate 1 from first interconnection layer 5a. Consequently, n type impurity diffusion layer 7 can be formed continuous to one of the source/drain regions 6. In this manner, the semiconductor device in accordance with this embodiment is completed.

As a modification of the manufacturing process shown in FIGS. 2 to 9, silicon oxide film 3 in contact hole 10 may be removed by anisotropic dry etching, not the wet etching using hydrofluoric acid solution shown in FIG. 4. In that case, the problem of foreign matters on the first interconnection layer 4a caused by wet etching using hydrofluoric acid solution does not arise. Therefore, increase in contact resistance between the first and second interconnection layers 4a and 5a caused by the foreign matters and the like can be prevented.

Though a two-layered interconnection structure including first and second interconnection layers 4a and 4b has been described above, similar effects can be obtained in an interconnection structure including three or more layers. For example, similar effects can be obtained when a third interconnection layer of WSi, for example, is formed in order to lower resistance of the multilayered interconnection.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate having a main surface;

an element isolation insulating film formed on the main surface of said semiconductor substrate;

a conductive layer formed in contact with the main surface of said semiconductor substrate over a contact portion and in contact with a surface of said element isolation insulating film; wherein at least an upper surface of said element isolating insulating film at a boundary point between said element isolating insulating film and said semiconductor substrate has been removed to form a concavity below the main surface of the semiconductor substrate which concavity forms part of the contact portion; and said conductive layer is formed on contact with said semiconductor substrate and said element isolating insulating film positioned near said boundary point, wherein a step is formed at a region of the upper surface of said element isolating insulating film positioned below a side surface of said first interconnection layer.

2. The semiconductor device according to claim 1, wherein an impurity region of a first conductivity type is formed at the contact portion.

3. The semiconductor device according to claim 1, wherein said conductive layer includes a first interconnection layer formed on the upper surface of said element isolating insulating film, and a second interconnection layer formed in contact with said first interconnection layer, said element isolating insulating film and said semiconductor substrate.

4. The semiconductor device according to claim 2, further comprising:

a pair of source/drain regions of a first conductivity type formed spaced by a distance to define a channel region at the main surface of said semiconductor substrate, and a gate electrode formed on said channel region with a gate insulating film interposed; wherein one of said source/drain regions is formed continuous to said impurity region of the first conductivity type.

5. The semiconductor device according to claim 4, wherein said conductive layer includes a first interconnection layer formed on the upper surface of said element isolating insulating film, and a second interconnection layer formed in contact with said first interconnection layer, said element isolating insulating film and said impurity region;

said gate electrode includes upper and lower layers; and said first interconnection layer and the lower layer of said gate electrode are formed of one same layer, and said second interconnection layer and the upper layer of said gate electrode are formed of one same layer.

* * * * *